United States Patent
Cherian et al.

(10) Patent No.: US 6,841,479 B2
(45) Date of Patent: Jan. 11, 2005

(54) METHOD OF REDUCING IN-TRENCH SMEARING DURING POLISHING

(75) Inventors: Isaac K. Cherian, Aurora, IL (US); Paul M. Feeney, Aurora, IL (US); Kevin J. Moeggenborg, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 78 days.

(21) Appl. No.: 10/119,862

(22) Filed: Apr. 10, 2002

(65) Prior Publication Data

US 2002/0151177 A1 Oct. 17, 2002

Related U.S. Application Data

(60) Provisional application No. 60/283,422, filed on Apr. 12, 2001.

(51) Int. Cl.[7] ............................................. H01L 21/302
(52) U.S. Cl. ....................................... 438/690; 438/692
(58) Field of Search ................................ 438/690, 691, 438/692, 693

(56) References Cited

U.S. PATENT DOCUMENTS

| | | | | |
|---|---|---|---|---|
| 4,268,951 A | * | 5/1981 | Elliott et al. | 438/289 |
| 4,546,534 A | * | 10/1985 | Nicholas | 438/298 |
| 5,891,804 A | * | 4/1999 | Havemann et al. | 438/674 |
| 5,976,970 A | * | 11/1999 | Dalal et al. | 438/637 |
| 6,010,962 A | * | 1/2000 | Liu et al. | 438/687 |
| 6,043,146 A | * | 3/2000 | Watanabe et al. | 438/623 |
| 6,124,164 A | | 9/2000 | Al-Shareef et al. | |
| 6,150,690 A | | 11/2000 | Ishibashi et al. | |
| 6,153,525 A | | 11/2000 | Hendricks et al. | |
| 6,159,818 A | | 12/2000 | Durcan et al. | |
| 6,271,083 B1 | | 8/2001 | Lou | |
| 6,278,153 B1 | | 8/2001 | Kikuchi et al. | |
| 6,372,616 B1 | | 4/2002 | Yoo et al. | |

FOREIGN PATENT DOCUMENTS

| EP | 1083597 | 3/2001 | |
|---|---|---|---|
| EP | 1 083 597 A2 | * 3/2001 | ......... H01L/21/768 |

OTHER PUBLICATIONS

Database WPI, Section Ch., Week 200140, Derwent Publications, Ltd., London, GB; AN 2001–380044 XP002214080 & TW 417 293 A Worldwide Semiconductor Mfg. Corp ), Jan. 1, 2001 abstract.

Patent Abstracts of Japan, vol. 2000, No. 11, Jan. 3, 2001, & JP 2000–223362 A (NEC Corp.), Aug. 11, 2000 abstract.

* cited by examiner

Primary Examiner—Kin-Chan Chen
(74) Attorney, Agent, or Firm—Robert M. Lanning

(57) ABSTRACT

The invention provides a method of reducing in-trench smearing during polishing. The method comprises providing a substrate comprising a first layer comprising an insulating material, a second layer comprising a filling material, and a plurality of field and trench regions. A polymeric material is infiltrated over the substrate, wherein the polymeric material fills the trench regions and covers the field regions. The polymeric material optionally is removed from the field regions, followed by baking of the substrate such that the polymeric material in the trench regions becomes recessed below the insulating material of the field regions. The substrate is then subjected to a temperature of about 100° C. or more for about 30 minutes or longer, such that during polishing of the substrate, smearing of the filling material in the trench regions is reduced as compared to polishing of the substrate under the same conditions except for subjecting the substrate to the temperature of about 100° C. or more for about 30 minutes or longer. When desirable, a layer of additional material can be deposited over the polymeric material such that it forms a layer over the polymeric material in the trench regions and the filling material in the field regions. The substrate is then polished to obtain a substantially planar surface.

17 Claims, 1 Drawing Sheet

METHOD OF REDUCING IN-TRENCH SMEARING DURING POLISHING

Application claims the benefit of U.S. Provisional Application No. 60/283,422, filed Apr. 12, 2001.

FIELD OF THE INVENTION

This invention pertains to a method of polishing a substrate, particularly a substrate comprising a plurality of field and trench regions.

BACKGROUND OF THE INVENTION

As the size of integrated circuits is reduced and the number of integrated circuits on a chip increases, the components that make up the circuits must be positioned closer together in order to comply with the limited space available on a typical chip. Current research, therefore, is directed towards achieving a greater density of active components per unit area of a semiconductor substrate. In addition, the components must be oriented vertically by either building the devices up from the substrate surface or by burying the devices in trenches formed within the face of the semiconductor body. A trench capacitor, for example, has been used in dynamic random access memory (DRAM) cells and other circuits to try to further reduce the overall area of such devices.

A problem associated with semiconductor processing typically involves smearing of the materials over the trench regions during polishing. In particular, after trenches are filled, it is necessary to selectively remove layers of material from the "field" regions between each trench of the semiconductor substrate to achieve a highly planar surface topography. A highly planar surface topography is sought because it reduces both the potential for current leakage (i.e., short-circuiting) between active regions of the integrated circuit and the potential for depth of focus lithography problems during subsequent interconnect processing steps. However, during polishing, materials can be undesirably smeared over portions of the substrate surface, sometimes partially or wholly covering the trench regions, making subsequent wafer processing difficult. Accordingly, control of the smearing of materials over the trench regions following planarization or polishing processes is important for ensuring optimum semiconductor performance.

Attempts to solve the problem of providing a highly planarized integrated circuit structure, after having formed trench regions in the substrate, have resulted in a number of planarization schemes. Conventional planarization schemes include, for example, chemical mechanical polishing (CMP), use of permanent spin-on-glass (SOG), and sacrificial etchback SOG. Most conventional schemes, however, do not provide consistent desired results. Indeed, scratching, dishing, corner erosion, and/or smearing are common imperfections associated with many CMP processes when subsequent interconnect processing steps are required.

Thus, there remains a need for improved polishing methods, particularly methods that can reduce in-trench smearing during polishing. The present invention seeks to provide such a method. These and other advantages of the present invention will be apparent from the description of the invention provided herein.

BRIEF SUMMARY OF THE INVENTION

The invention provides a method of reducing in-trench smearing during polishing. The method comprises providing a substrate comprising a first layer comprising an insulating material, a second layer comprising a filling material, and a plurality of field and trench regions. A polymeric material is infiltrated over the substrate, wherein the polymeric material fills the trench regions and covers the field regions. The polymeric material optionally is removed from the field regions, followed by baking of the substrate such that the polymeric material in the trench regions becomes recessed below the insulating material of the field regions. Whether or not the polymeric material is removed from the field regions, the substrate is then subjected to a temperature of about 100° C. or more for about 30 minutes or longer, such that during polishing of the substrate, smearing of the filling material in the trench regions is reduced as compared to polishing of the substrate under the same conditions except for subjecting the substrate to the temperature of about 100° C. or more for about 30 minutes or longer. When desirable, a layer of additional material can be deposited over the polymeric material such that it forms a layer over the polymeric material in the trench regions and the filling material in the field regions. The substrate is then polished to remove the polymeric material and filling material from the field regions of the substrate and to make the polymeric material in the trench regions substantially planar with or recessed below the insulating material of the field regions. If a layer of additional material is present, the additional material can be removed from the field regions of the substrate while the additional material in the trench regions is made to be substantially planar with the insulating material of the field regions.

DETAILED DESCRIPTION OF THE INVENTION

Figure 1:
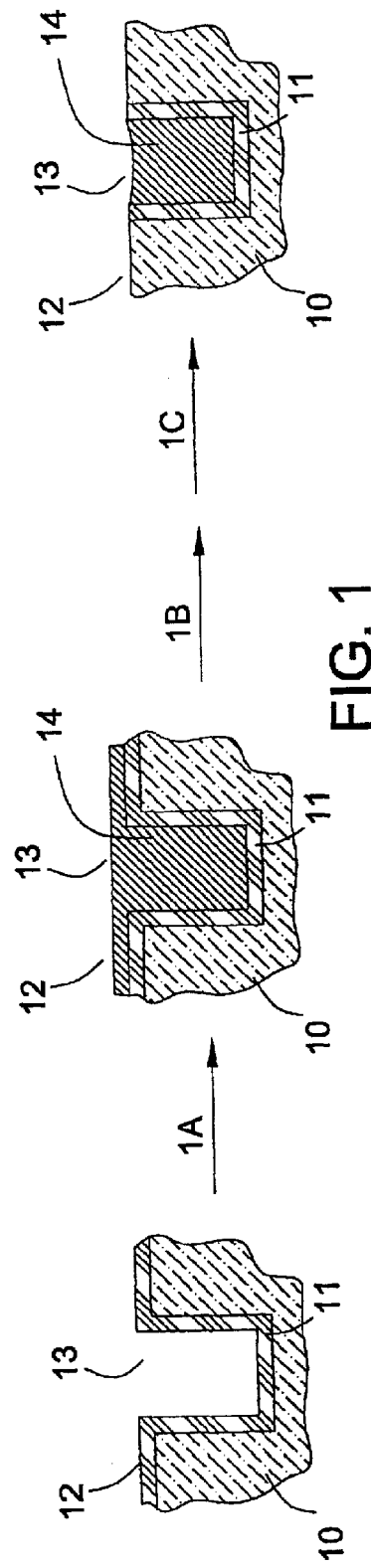
FIG. 1 is a diagram depicting the steps utilized in the invention to reduce in-trench smearing during polishing.
Figure 2:
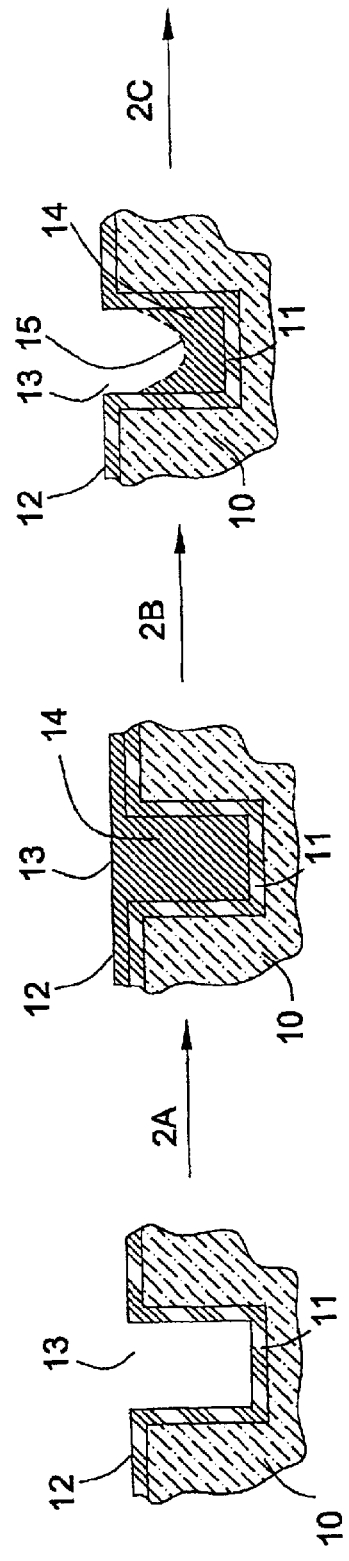
FIG. 2 is a diagram depicting additional steps that can be utilized in the invention to reduce in-trench smearing during polishing.

As illustrated in FIGS. 1 and 2, the invention provides a method of polishing a substrate comprising the following sequential steps: (a) providing a substrate comprising (i) a first layer comprising an insulating material (10), (ii) a second layer comprising a filling material (11) that differs from the insulating material, and (iii) a plurality of field (12) and trench regions (13), (b) infiltrating a polymeric material over the substrate (steps 1A and 2A), wherein the polymeric material (14) fills the trench regions and covers the field regions, (c) subjecting the substrate to a temperature of about 100° C. or more for about 30 minutes or longer, such that during polishing of the substrate, smearing of the filling material in the trench regions becomes reduced as compared to polishing of the substrate under the same conditions except for subjecting the substrate to the temperature of about 100° C. or more for about 30 minutes or longer (step 1B), and (d) polishing the substrate to remove the polymeric material (14) and filling material (11) from the field regions (12) of the substrate and to make the polymeric material (14) in the trench regions (13) substantially planar with or recessed below the insulating material (10) of the field regions (12) (step 1C). The method can further comprise, between steps (b) and (c), (i) removal of the polymeric material (14) from the field regions (12) and (ii) baking of the substrate such that the polymeric material (14) in the trench regions becomes recessed below the insulating material (10) of the field regions (12) (step 2B). Once the recession has formed (15), the method can further comprise, between steps (c) and (d), depositing a layer of additional material (16) over the polymeric material (14) (step 2C), wherein the additional material has a higher modulus than the polymeric material such that the additional material (16) forms a layer over the polymeric material (14) in the trench regions (13) and the filling material (11) in the field regions (12) and wherein step (d) further comprises polishing or etching the substrate to remove the additional material (16) from the field regions (12) of the substrate and to make the additional material (16) in the trench regions (13) substantially planar with the insulating material (10) of the field regions (12) (step 2D).

The invention can be used to polish any suitable substrate. Suitable substrates include wafers used in the semiconductor industry that are in need of polishing or planarizing. They comprise, for example, an insulating material, a filling material, and a plurality of field and trench regions. The field regions of the substrate are those regions located on the surface of the substrate between the trench regions. There can be any number of field and/or trench regions on the substrate but generally there is at least one of each. The insulating material generally represents the first or base layer of the substrate. Suitable insulating materials include, for example, silica. The filling material is generally deposited on top of the insulating material to form the second layer of the substrate. Typically, the filling material is a metal or a high K dielectric material. By high K is meant those dielectric materials exhibiting a dielectric constant above 4.5. If used, the high K dielectric material preferably is tantalum pentoxide ($Ta_2O_5$). If the filling material is a metal, any metal can be used. Typically, the metal used will be a transition metal or a Group IIIA metal, as represented in the periodic table. Preferred metals include copper, aluminum, tantalum, titanium, tungsten, gold, platinum, iridium, ruthenium, and combinations (e.g., alloys or mixtures) thereof, with platinum being preferred. The substrate also can comprise metal oxides such as, alumina, silica, titania, ceria, zirconia, germania, magnesia, and co-formed products thereof, and mixtures thereof. In addition, the substrate can comprise metal composites and/or alloys such as metal nitrides (e.g., silicon nitride, tantalum nitride, titanium nitride, and tungsten nitride), metal carbides (e.g., silicon carbide and tungsten carbide), nickel-phosphorus, aluminoborosilicate, borosilicate glass, phosphosilicate glass (PSG), borophosphosilicate glass (BPSG), silicon-germanium alloys, and silicon-germanium-carbon alloys. The substrate also can comprise semiconductor base materials such as single-crystal silicon, poly-crystalline silicon, amorphous silicon, silicon-on-insulator, and gallium arsenide. The invention is not limited to semiconductor polishing; it also can be applied to glass substrates, including technical glass, optical glass, and ceramics, of various types known in the art.

The polymeric material used in conjunction with the inventive polishing method can be any suitable polymeric material. Suitable polymeric materials include, for example, a polymer film (e.g., a photoresist or a polyimide). Preferably, the polymeric material comprises a photoresist. As discussed above, the polymeric material is infiltrated over the substrate in a sufficient amount such that it will fill the trench regions and cover the field regions. That is to say that the polymeric material is deposited onto the substrate in a sufficient amount such that the polymeric material fills the trench regions and overflows onto the field regions to form a contiguous layer over the surface of the substrate.

At this point in the inventive polishing method, if desired (i.e., optionally), the polymeric material can be removed from the field regions. The removal of the polymeric material is followed by baking of the substrate such that the polymeric material in the trench regions becomes recessed below the insulating material of the field regions.

The substrate then is subjected to temperatures of about 100° C. or more for about 30 minutes or longer, such that during polishing of the substrate, smearing of the filling material in the trench regions is reduced as compared to polishing of the substrate under the same conditions except for subjecting the substrate to the temperature of about 100° C. or more for about 30 minutes or longer. Suitable temperatures for this to occur include, for example, temperatures ranging from about 100–200° C. or more. Preferably, the substrate is subjected to a temperature of about 150° C. or more (e.g., about 150–175° C.), and more preferably a temperature of about 175° C. or more (e.g., about 175–200° C.). The substrate can be exposed to these temperatures for any suitable amount of time. Typically, the substrate is exposed to a temperature of about 100–200° C. or more (e.g., about 150–175° C., or even about 175–200° C.) for about 30 minutes or longer. Preferably, the substrate is exposed to a temperature of about 100–200° C. or more (e.g., about 150–175° C., or even about 175–200° C.) for about 1 hour or longer, for about 1.5 hours or longer, or even for about 2 hours or longer. It is most preferred that the substrate be exposed to a temperature of about 175° C. or more for about 1 hour or longer.

One or more layers of additional material (e.g., a spin on glass), if desired (i.e., optionally), subsequently can be deposited onto the substrate, where it forms a layer over the recessed polymeric material in the trench regions and the polymeric material (if not removed) or filling material (if the polymeric material was removed as discussed above) in the field regions. The additional material can be any suitable material that has a higher modulus than the polymeric material. Suitable additional materials include, for example, a spin on glass (SOG), silicon dioxide, silicon nitride, or mixtures thereof. Preferably, the additional material is a spin on glass. Once the additional material has been deposited onto the substrate, heat can be applied to the substrate to harden the additional material.

The materials used in conjunction with the invention can be deposited onto the substrate by any suitable means. For example, the materials can be deposited by chemical vapor deposition (CVD), such as plasma enhanced CVD or low pressure CVD. This gaseous process deposits the materials onto the substrate at elevated temperatures and often reduced pressures. The materials also can be deposited by physical vapor deposition (PVD), such as sputtering. This process deposits a thin film on a substrate by aiming a stream of gas at a target. Secondary emission releases material from the target, which is then deposited on the wafer. Another suitable means for the deposition of materials is by high density plasma (HDP) processing. In HDP processing, for example, interlayer dielectric material is deposited over and between the interconnect lines while simultaneously being sputtered away. This method prevents the formation of voids in the insulating material between the closely-spaced metal stacks while reducing fabrication time.

The inventive polishing method can be used to polish any part of a substrate (e.g., a semiconductor device) at any stage in the production of the substrate. For example, a particularly effective use of the inventive method is in polishing a semiconductor device in conjunction with the formation of an interlayer dielectric (ILD) as is known in art.

An accepted method of polishing (also known as planarizing) semiconductor devices involves polishing the surface of the semiconductor with a polishing composition and/or a polishing pad, such as is accomplished by chemical-mechanical polishing (CMP). In a typical CMP process, a wafer is pressed against a polishing pad in the presence of a polishing composition (also known as a slurry) under controlled chemical, pressure, velocity, and temperature conditions. The polishing composition generally contains small, abrasive particles that abrade the surface of the wafer in a mixture with chemicals that oxidize and/or otherwise act upon the newly formed surface of the wafer. The polishing pad generally is a planar pad made from a continuous phase matrix material such as polyurethane. Thus, when the polishing pad and wafer move with respect to each other, material is removed from the surface of the wafer mechanically by the abrasive particles and chemically by the oxidants and/or other chemical components in the polishing composition.

Any suitable abrasive can be used in conjunction with the inventive polishing method. Suitable abrasives are capable of polishing a substrate surface without unduly introducing deleterious scratches or other imperfections in the substrate surface. The abrasive preferably is a metal oxide. Suitable metal oxide abrasives include, for example, alumina, silica, titania, ceria, zirconia, magnesia, co-formed products thereof, and mixtures thereof. Preferably, the metal oxide abrasive used in conjunction with the inventive polishing method is crystalline alumina.

The abrasive can have any suitable abrasive particle characteristics depending on the desired polishing effects. In particular, the abrasive can have any suitable surface area. A suitable abrasive surface area, for example, is a surface area ranging from about 5–430 $m^2/g$ (e.g., about 5–200 $m^2/g$), as calculated from the method of S. Brunauer, P. H. Emmet, and I. Teller, *J. Am. Chem. Soc.,* 60, 309 (1938), which is commonly referred to as the BET method. Desirably, the surface area of the abrasive used in conjunction with the present invention is about 90 $m^2/g$ or more.

The abrasive can be combined with (e.g., suspended in) any suitable liquid in the polishing composition. Suitable liquids generally include polar solvents, preferably water or an aqueous solvent. Where the abrasive is included in the polishing composition, the abrasive can be present in any suitable concentration. Generally, the polishing composition will contain about 0.1 wt. % or more abrasive, e.g., crystalline alumina. Desirably, the polishing composition will have about 0.5–50 wt. % abrasive, e.g., crystalline alumina. Polishing compositions containing about 2–25 wt. % abrasive, e.g., crystalline alumina, are preferred, with about 4–12 wt. % abrasive, e.g., crystalline alumina, being most preferred.

The abrasive can be fixed (e.g., embedded) in or on a polishing pad in addition to or alternatively to the abrasive being suspended in a liquid in the polishing composition. The aforementioned considerations as to the type of abrasive particle suitable for suspension in the polishing composition are applicable to embedded abrasives. Any suitable amount of abrasive can be embedded in the pad. A suitable amount is any amount sufficient to provide for polishing of a substrate surface at a suitable rate without introducing unduly deleterious scratches or other imperfections in the substrate surface.

Any suitable polishing pad (e.g., polishing surface) can be used in conjunction with the inventive polishing method. Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, and co-formed products thereof, and mixtures thereof. As discussed above, the abrasive can be fixed (e.g., embedded), in whole or in part, in or on the polishing pad. Such fixation on the polishing pad can be accomplished, for example, by blending the abrasive into the aforementioned polymers during the formation of the polishing pad or by adhering the abrasive to the pad after the pad is formed using such adherents as are known.

Following polishing of the substrate, the used polishing composition can be combined with any compound(s) suitable for enhancing the disposability of the polishing composition. Suitable compounds include, for example, acids, which will decrease the pH of the used polishing composition, calcium-containing salts which will act as complexing agents to fluoride ions, and other compounds known to ordinary artisans. These compounds can be added to the polishing composition in any suitable manner. For example, these compounds can be added to the waste stream by which the polishing composition exits the polishing surface.

The inventive polishing method allows for polishing of a substrate to occur such that smearing of filling material in the trench regions is reduced. As discussed previously, this method involves subjecting the substrate with an overlay of polymeric material to a temperature of about 100° C. or more for about 30 minutes or longer. By subjecting the substrate to such conditions, the polymeric material becomes firm (e.g., hardens). Since the polymeric material becomes firm, the filling material "fractures of" the trench regions during polishing, as opposed to being smeared over the top of the trench, which would make subsequent wafer processing difficult. Furthermore, where the polymeric material has been removed from the field regions and the substrate has been baked, such that the polymeric material in the trench regions has become recessed below the insulating material of the field regions, and where a layer of additional material has been deposited over the recessed polymeric material in the trench regions, it is thought that the solidified additional material on top of the polymeric material in the trench regions serves the same purpose as the firmed polymeric material as described above (i.e., allows for the filling material to "fracture off" the trench regions of the substrate during polishing). Therefore, during polishing of the substrate, smearing of the filling material in the trench regions is substantially reduced or eliminated.

Once polishing of the substrate is completed, the substrate can be subjected to other processes (e.g., ashing, etching, and the like). For example, after polishing the substrate to expose the insulating material covering the field regions and the polymeric material in the trench regions, the substrate can be ashed by methods known in the art. A typical ashing process involves placing the substrate in an oxygen plasma environment, which exposes the substrate to temperatures of about 200–300° C. This results in the complete breakdown of the polymeric material, for example, to carbon monoxide, carbon dioxide, and water. Successful ashing will remove the polymeric material from the trench regions, thereby exposing the filling material in the trench regions. Where an additional material has been deposited onto the substrate, the substrate can be etched before the ashing step to remove the additional material from the substrate. Suitable etchants that can be used in conjunction with the invention include, for example, ammonium salts, quaternary ammonium salts, peroxides, chlorates, perchlorates, permanganates, persulfates, fluorides, and mixtures thereof. Preferably, the etchant is a fluoride, and more preferably the etchant is hydrogen fluoride.

In addition to reducing smearing of the filling material, the inventive polishing method described herein also can reduce other imperfections typically experienced when polishing a substrate. For example, the polishing method allows for a reduction in dishing as well as a reduction in comer erosion.

A variety of other components can be used in conjunction with the inventive polishing method. For example, film-forming agents, complexing agents, surfactants, rheological control agents, polymeric stabilizers or surface-active dispersing agents, and/or halide ions can be used as described hereinafter.

Any suitable film-forming agent (e.g., corrosion-inhibitor) can be used in conjunction with the inventive method. For example, suitable film-forming agents generally include surface-active agents (i.e., surfactants) that preferentially adsorb to and prevent polishing of silicon nitride. Therefore, suitable film-forming agents include, for example, alkylamines, alkanolamines, hydroxylamines, phosphate esters, sodium laurylsulfate, fatty acids, polyacrylates, polymethacrylates, polyvinylphosphonates, polymalate, polystyrenesulfonate, and polyvinylsulfonate. Other suitable film-forming agents include, for example, benzotriazole, triazole, benzimidazole, and mixtures thereof.

Any suitable complexing agent (i.e., chelating agent or selectivity enhancer) can be used in conjunction with the inventive method. Suitable complexing agents include, for example, carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., disodium EDTA), mixtures thereof, and the like), and carboxylates containing one or more sulfonic and/or phosphonic groups. Suitable chelating or complexing agents also can include, for example, di-, tri-, or poly-alcohols (e.g., ethylene glycol, pyrocatechol, pyrogallol tannic acid, and the like) and phosphate-containing compounds, e.g., phosphonium salts, and phosphonic acids. Complexing agents also can include amine-containing compounds (e.g., amino acids, amino alcohols, di-, tri-, and poly-amines, and the like). Examples of amine-containing compounds include methylamine, dimethylamine, trimethylamine, ethylamine, diethylamine, triethylamine, ethanolamine, diethanolamine, diethanolamine cocate, triethanolamine, isopropanolamine, diisopropanolamine, triisopropanolamine, nitrosodiethanolamine, and mixtures thereof. Suitable amine-containing compounds further include ammonium salts (e.g., tetramethylamine and quaternary ammonium compounds). The amine-containing compound also can be any suitable cationic amine-containing compound, such as, for example, hydrogenated amines and quaternary ammonium compounds, that adsorbs to a silicon nitride layer present on the substrate being polished and reduces, substantially reduces, or even inhibits (i.e., blocks) the removal of silicon nitride during polishing.

Any suitable surfactant and/or rheological control agent can be used in conjunction with the inventive method, including viscosity enhancing agents and coagulants. Suitable surfactants include, for example, cationic surfactants, anionic surfactants, anionic polyelectrolytes, nonionic surfactants, amphoteric surfactants, fluorinated surfactants, mixtures thereof, and the like. Suitable rheological control agents include, for example, polymeric rheological control agents. Moreover, suitable rheological control agents include, for example, urethane polymers (e.g., urethane polymers with a molecular weight greater than about 100,000 Daltons), acrylates comprising one or more acrylic subunits (e.g., vinyl acrylates and styrene acrylates), and polymers, copolymers, and oligomers thereof, and salts thereof.

The inventive polishing method can contain any suitable polymeric stabilizer or other surface-active dispersing agent. Suitable stabilizers include, for example, phosphoric acid, organic acids, tin oxides, organic phosphonates, mixtures thereof, and the like.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate comprising the following sequential steps:
    (a) providing a substrate comprising (i) a first layer comprising an insulating material, (ii) a second layer comprising a filling material that differs from the insulating material, and (iii) a plurality of field and trench regions;

(b) infiltrating a polymeric material over the substrate, wherein the polymeric material fills the trench regions and covers the field regions;

(c) removing the polymeric material from the field regions to expose the filling material in the field regions;

(d) subjecting the substrate to a temperature of about 100° C. or more for about 30 minutes or longer to bake the substrate, such that the polymeric material in the trench regions becomes recessed below the insulating material of the field regions (e) depositing a layer of additional material with a higher modulus than the polymeric material over the polymeric material in the trench regions and the filling material in the field regions; and (f) polishing or etching the substrate to remove the additional material and filling material from the field regions of the substrate and to make the additional material in the trench regions substantially planar with or recessed below the insulating material of the field regions.

2. The method of claim 1, wherein the filling material is a high K dielectric material.

3. The method of claim 2, wherein the high K dielectric material is tantalum pentoxide.

4. The method of claim 1, wherein the filling material is a metal.

5. The method of claim 4, wherein the metal is a transition metal or a Group IIIA metal, as represented in the periodic table.

6. The method of claim 5, wherein the metal is selected from the group consisting of copper, aluminum, tantalum, titanium, tungsten, gold, platinum, iridium, ruthenium, cobalt, nickel, chromium, and mixtures thereof.

7. The method of claim 6, wherein the metal is platinum.

8. The method of claim 1, wherein the polymeric material comprises a photoresist, a polyimide, or a mixture thereof.

9. The method of claim 8, wherein the polymeric material comprises a photoresist.

10. The method of claim 1, wherein smearing of the filling material in the trench regions is substantially reduced during polishing.

11. The method of claim 10, wherein smearing of the filling material in the trench regions is eliminated during polishing.

12. The method of claim 1, wherein the layer of additional material comprises a spin on glass, silicon dioxide, or a mixture thereof.

13. The method of claim 12, wherein the layer of additional material comprises a spin on glass.

14. The method of claim 1, wherein the method further comprises, after step (f), (g) etching the substrate with an etchant such that the layer of additional material is removed, and (h) ashing the substrate such that the polymeric material in the trench regions is removed.

15. The method of claim 14, wherein the etchant is selected from the group consisting of sodium salts, potassium salts, ammonium salts, quaternary ammonium salts, peroxides, chlorates, perchlorates, permanganates, persulfates, fluorides, and mixtures thereof.

16. The method of claim 15, wherein the etchant is a fluoride.

17. The method of claim 16, wherein the etchant is hydrogen fluoride.

* * * * *